US009433132B2

(12) United States Patent
Krishnan et al.

(10) Patent No.: US 9,433,132 B2
(45) Date of Patent: Aug. 30, 2016

(54) RECIRCULATING DIELECTRIC FLUID COOLING

(71) Applicant: Intel Corporation, Santa Clara, CA (US)

(72) Inventors: Shankar Krishnan, Portland, OR (US); Eric D. McAfee, Portland, OR (US); Tod A. Byquist, Federal Way, WA (US)

(73) Assignee: Intel Corporation, Santa Clara, CA (US)

( * ) Notice: Subject to any disclaimer, the term of this patent is extended or adjusted under 35 U.S.C. 154(b) by 84 days.

(21) Appl. No.: 14/455,337

(22) Filed: Aug. 8, 2014

(65) Prior Publication Data
US 2016/0044833 A1    Feb. 11, 2016

(51) Int. Cl.
*H05K 7/20* (2006.01)
*H01L 23/473* (2006.01)

(52) U.S. Cl.
CPC .......... *H05K 7/20818* (2013.01); *H05K 7/203* (2013.01)

(58) Field of Classification Search
CPC ............................ G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ....... 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| 6,019,167 | A  | * | 2/2000  | Bishop ...................... F28F 1/10 165/104.19 |
| 7,403,392 | B2 | * | 7/2008  | Attlesey .................... G06F 1/20 165/104.33 |
| 8,953,318 | B1 | * | 2/2015  | Smith ................... H01L 23/427 165/104.33 |
| 2002/0021557 | A1 | * | 2/2002  | Ishimine ................ G06F 1/181 361/720 |
| 2003/0010477 | A1 | * | 1/2003  | Khrustalev ........ H05K 7/20681 165/104.33 |
| 2003/0205363 | A1 | * | 11/2003 | Chu ..................... F28D 15/0266 165/80.3 |
| 2004/0118142 | A1 | * | 6/2004  | Hsu .......................... B60L 1/02 62/259.2 |
| 2006/0060331 | A1 | * | 3/2006  | Glezer ............... F28D 15/0266 165/104.29 |

(Continued)

OTHER PUBLICATIONS

Tuma, Phillip E., "The Merits of Open Bath Immersion Cooling of Datacom Equipment", 26th IEEE Semi-Therm Symposium, St. Paul, MN, 2010, 9 pages.

*Primary Examiner* — Anthony Haughton
*Assistant Examiner* — Razmeen Gafur
(74) *Attorney, Agent, or Firm* — Schwabe, Williamson & Wyatt, P.C.

(57) ABSTRACT

Embodiments of the present disclosure are directed toward techniques and configurations for immersion cooling. In embodiments, an apparatus configured for immersion cooling may include a number of trays and a fluid circulation system. The number of trays may be configured to hold one or more circuit boards and may have a first opening to allow dielectric fluid to be injected into the tray, and a second opening to allow for escape of the dielectric fluid. The fluid circulation system may include a catchment area to collect the dielectric fluid that escapes from the plurality of trays and a distribution manifold coupled with the catchment area, to deliver the dielectric fluid collected in the catchment area back to the plurality of trays. Other embodiments may be described and/or claimed.

23 Claims, 5 Drawing Sheets

(56) References Cited

U.S. PATENT DOCUMENTS

| | | | | |
|---|---|---|---|---|
| 2007/0297136 A1* | 12/2007 | Konshak | ............ | H05K 7/20772 361/699 |
| 2008/0196868 A1* | 8/2008 | Attlesey | ................. | G06F 1/181 165/104.33 |
| 2009/0086434 A1* | 4/2009 | Hodes | ................ | H05K 7/20754 361/700 |
| 2009/0260777 A1* | 10/2009 | Attlesey | .................... | G06F 1/20 165/67 |
| 2010/0101759 A1* | 4/2010 | Campbell | .......... | H05K 7/20772 165/80.4 |
| 2010/0103618 A1* | 4/2010 | Campbell | .......... | H05K 7/20772 361/699 |
| 2010/0103620 A1* | 4/2010 | Campbell | .......... | H05K 7/20772 361/702 |
| 2010/0271779 A1* | 10/2010 | Nishiura | ............... | H01L 23/473 361/699 |
| 2011/0056225 A1* | 3/2011 | Campbell | ........... | F28D 15/0266 62/208 |
| 2011/0132579 A1* | 6/2011 | Best | ................... | H05K 7/20763 165/104.31 |
| 2011/0154842 A1* | 6/2011 | Heydari | ............ | H05K 7/20836 62/259.2 |
| 2011/0315344 A1* | 12/2011 | Campbell | ................ | F28F 3/04 165/80.4 |
| 2011/0315355 A1* | 12/2011 | Campbell | .......... | H05K 7/20809 165/104.33 |
| 2011/0317367 A1* | 12/2011 | Campbell | .......... | H05K 7/20809 361/700 |
| 2012/0320527 A1* | 12/2012 | Nishiura | ............ | H05K 7/20218 361/699 |
| 2013/0021746 A1* | 1/2013 | Campbell | .......... | H05K 7/20145 361/679.47 |
| 2013/0194755 A1* | 8/2013 | Ling | ................. | H05K 7/20545 361/721 |

* cited by examiner

RECIRCULATING DIELECTRIC FLUID COOLING

FIELD

Embodiments of the present disclosure generally relate to the field of thermal cooling of computing devices, and more particularly, to immersion cooling of computing devices.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Traditional air-cooled datacenters may suffer from limited energy efficiency, very low-component density (e.g., high datacenter footprint), lack of waste-heat recovery capability and high operating cost. While air cooling is still the standard for datacenter cooling, liquid cooling has been steadily increasing in the context of high-performance computing (HPC) because liquid cooling may offer higher component density, waste heat recovery capabilities, and lower operating costs. One form of liquid cooling, immersion cooling, involves immersion of computing components in a dielectric liquid. Under the current state of the art, however, immersion cooling systems may be prohibitively expensive to implement due to design complexity and non-standard rack designs (e.g., electronic boards are often immersed in a large tank of dielectric fluid) which may require costly re-design of physical infrastructure. As a result, immersion cooling has yet to be widely adopted.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure include techniques and configurations for immersion cooling of computing servers. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Figure 1:
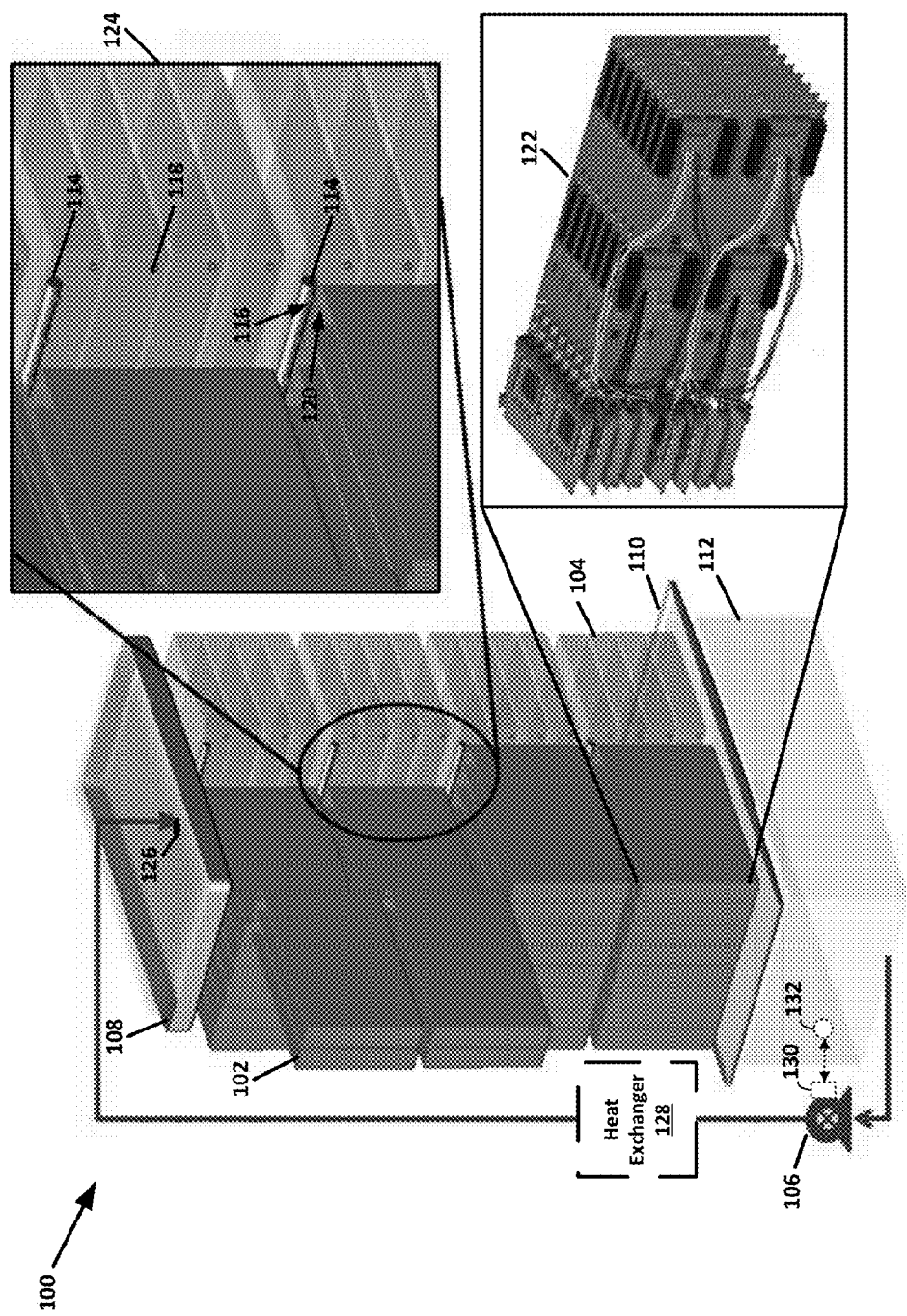
FIG. 1 illustrates a perspective and exploded view of a server system having an immersion cooling arrangement of the present disclosure, in accordance with various embodiments of the present disclosure.

FIG. 1 illustrates a perspective and exploded view of a computer server rack assembly 100, hereinafter "server system 100," having an immersion cooling arrangement of the present disclosure, in accordance with various embodiments. In embodiments, the immersion cooling arrangement may include a number of computing device trays, such as vertical computing device trays 102 and horizontal computing device trays 104, hereinafter referred to collectively as computing device trays for simplicity. The computing device trays may be secured to a rack or enclosure of server system 100 using any conventional mechanisms for securing electronic components in a traditional rack system (e.g., rails, etc.). As a result, standard rack designs may be utilized in conjunction with the immersion cooling arrangement of the present disclosure.

Individual computing device trays may be configured to hold dielectric fluid and one or more circuit boards, such as circuit boards 122, immersed in the dielectric fluid. By immersing the one or more circuit boards in individual computing device trays, the amount of dielectric fluid needed for the operation of sever system 100 having the immersion cooling arrangement of the present disclosure may be reduced. In addition, because the amount of dielectric fluid may be reduced, the amount of weight that the physical infrastructure needs to support would be reduced as well. Such a reduction in weight may enable server system 100, having the immersion cooling arrangement of the present disclosure, to be implemented in existing physical infrastructures without the need for redesign of the physical infrastructures to support the additional weight from the immersion cooling arrangement. For example, server system 100 having the immersion cooling arrangement of the present disclosure may be able to be implemented in a physical infrastructure designed to support 250 pounds per square foot, as is the current standard. In addition, by housing the one or more circuit boards in individual computing device trays, the one or more circuit boards may be more easily hot-swappable, which may be a requirement in, for example, a data center, a server farm, etc.

The dielectric fluid may be configured to absorb thermal energy generated by circuit boards 122. Such dielectric fluid may include, but is not limited to, mineral oil, castor oil, silicone oil, or any of the Novec® engineered fluids from 3M®. In some embodiments, the dielectric fluid may be configured to vaporize into a dielectric gas in response to absorption of the thermal energy generated by the one or more circuit boards. Such embodiments may be referred to herein as a two-phase immersion cooling arrangement, or simply as a two-phase embodiment, while embodiments where the dielectric is maintained in a liquid phase, may be referred to as a single-phase immersion cooling arrangement, or simply as a single-phase embodiment. The two-phase immersion cooling arrangement is discussed in greater detail in reference to FIGS. 4-6, below.

In embodiments, the computing device trays may have openings (e.g., outlet port 118) formed in the computing device trays and configured to allow for controlled escape of dielectric fluid from the computing device trays, e.g., into the server rack assembly. This escape of fluid may allow movement of thermal energy absorbed by the dielectric fluid away from the circuit boards. In various embodiments, these openings may be configured to allow for escape of the dielectric fluid through one or more of leakage of the dielectric fluid (e.g., via outlet port 118), overflow of the dielectric fluid (e.g., via a top opening of the computing device trays) or vaporization of the dielectric fluid in a two-phase immersion cooling system (e.g., via a top opening or perforations of a top portion of the computing device trays).

In order to maintain a sufficient level of dielectric fluid in the computing device trays, the computing device trays may have additional openings (e.g., inlet port 120) to allow for the delivery of dielectric fluid to the computing device trays. As used herein, a sufficient level of dielectric fluid is a level of fluid sufficient to encompass applicable heat producing portions of the one or more circuit boards (e.g., one or more processors). In some embodiments, the opening for escape of the dielectric fluid from one of the computing device trays and the opening for delivery of the dielectric fluid to the one of the computing device trays may be the same opening. For example, in a two-phase immersion cooling system, a top opening may allow for release of the dielectric gas resulting from the vaporization of the dielectric liquid while also allowing for the addition of dielectric liquid through the same top opening. Such an example would also be applicable where the dielectric liquid may escape from the computing device trays via overflow of the dielectric liquid from the computing device trays.

In embodiments, the computing device trays may have open tops, such as those depicted in FIG. 1, to allow for servicing and/or hot swapping of the one or more circuit boards contained therein (e.g. circuit boards 122). In addition, the computing device trays may be configured to allow for quick release of the dielectric fluid contained therein back into immersion cooling system 100. For example, in embodiments where the computing device trays have open tops, the open tops may allow for the quick release of the dielectric fluid contained therein by inversion of the computing device trays to allow for escape of the dielectric fluid through the top opening. This quick release of fluid may enable one or more of the computing device trays to be removed with little or no leakage or loss of the dielectric fluid outside of immersion cooling system 100. In addition, in some embodiments, the top opening may allow for routing of input/output (I/O) and power cabling to the one or more circuit boards contained therein. In other embodiments, routing features (e.g., a DIN connector, bus connector, or the like) may be formed in a side of the computing device trays to route I/O signals and power into and out of the computing device trays. In such embodiments, the connections may be sealed to prevent loss of dielectric fluid through the routing features, or the connections could be unsealed and any loss of dielectric fluid through the routing features may be taken into account in the fluid circulation system discussed below.

While depicted as being uniform in size, it will be appreciated that computing device trays may vary in size depending upon application. For example, a larger computing device tray may be utilized to hold a larger group of circuit boards while a smaller computing device tray may be utilized to hold a single circuit board. In such embodiments, the larger tray may be a multiple in size of the smaller trays to maintain an ability to swap the larger tray into a group of smaller trays. For example, the larger tray may be configured to be the width of three of the vertical computing device trays 102. As a result, the larger tray may be swapped into server system 100 by merely removing three adjacent vertical computing device trays and substituting the larger tray in place of the three adjacent vertical computing device trays that were removed.

In embodiments, the immersion cooling arrangement of server system 100 may include a fluid circulation system. The fluid circulation system may include a catchment area configured to collect dielectric fluid that may escape from, or may be released from, the computing device trays. As depicted, the catchment area may include a catchment tray 110 and a catchment reservoir 112. The catchment area may be disposed below the computing device trays to enable collection of the dielectric fluid that escapes from the plurality of trays and prevent loss of the dielectric fluid. Embodiments, of the catchment area are discussed in greater detail in reference to FIG. 2, below.

The fluid circulation system may also include distribution manifold 114. Distribution manifold 114 may have injection ports (e.g., injection port 116), disposed in positions above or adjacent to the computing device trays. Distribution manifold 114 may be coupled with the catchment area and may be configured to deliver the dielectric fluid that escapes from the computing device trays back to the computing device trays via the injection ports. The injection ports may be configured to inject the dielectric fluid into the computing device trays to maintain a sufficient level of dielectric fluid in the individual computing device trays.

In embodiments, the fluid circulation system may include pump 106. Pump 106 may couple distribution manifold 114 with catchment reservoir 112 and may be configured to deliver the dielectric fluid collected in catchment reservoir 112 to the distribution manifold. In embodiments, pump 106 may be configured to deliver the dielectric fluid collected in the catchment area at a rate equal to or greater than a rate at which the dielectric fluid may escape from the plurality of trays to ensure the computing device trays are maintained at a sufficient level. This may be accomplished by calculating a rate at which dielectric fluid may escape from the computing device trays and selecting a pump 106 to meet or exceed this rate. In some embodiments, pump 106 may be configured to provide an adjustable flow rate. In such embodiments, the flow rate of the pump may be able to be adjusted based upon changes to the configuration of immersion cooling system 100. In other embodiments, pump 106 may be configured with a controller 130 that may monitor a rate at which dielectric fluid enters the catchment area. In such embodiments, catchment area may be configured with a sensor 132 configured to monitor a level of the dielectric fluid in the catchment area or a rate at which the dielectric fluid may enter the catchment area. Sensor 132 may be communicatively coupled with controller 130 to enable controller 130 to monitor the rate at which dielectric fluid enters the catchment area.

Pump 106 may be external to the catchment area or may be located within the catchment are. For example, pump 106 may be configured as a sump pump and may be placed inside catchment reservoir 112. In some embodiments, pump 106 may be external to immersion cooling system 100. Such embodiments may be beneficial to prevent thermal energy produced by the operation of pump 106 from being introduced into immersion cooling system 100.

In some embodiments, pump 106 may couple distribution manifold 114 with catchment reservoir 112 by way of upper reservoir 108. In such embodiments, pump 106 may be configured to deliver dielectric fluid from catchment reservoir 112 to upper reservoir 108. This may be accomplished, in some embodiments, via a conduit having one end coupled with pump 106 and an opposite end disposed into a side or bottom of upper reservoir 108. In other embodiments, the opposite end may be disposed in an area over upper reservoir 108. Upper reservoir 108 may in turn provide the dielectric fluid to a central tube of distribution manifold 114 via opening 126, such a central tube configuration is discussed in greater detail in reference to FIG. 2, below. The dielectric fluid may then be delivered to injection ports (e.g., injection port 116) of distribution manifold 114 via a gravity feed configuration. In other embodiments, pump 106 may be directly coupled to the central tube of distribution manifold 114, for example, by way of connection to a top or bottom portion of the central tube, such a central tube configuration is discussed further in reference to FIG. 3, below.

In some embodiments, the fluid circulation system may include heat exchanger 128. Heat exchanger 128 may be coupled between pump 106 and distribution manifold 114. Heat exchanger 128 may be configured to extract thermal energy from the dielectric liquid to condition the dielectric liquid to absorb more thermal energy from the one or more circuit boards and thereby increase the cooling effect of the dielectric liquid. In such embodiments, the heat exchanger 128 may be located either outside the server rack system or inside the server rack system. In embodiments where the heat exchanger is located inside the server rack system, the heat exchanger may exhaust thermal energy extracted from the dielectric liquid to an area outside the server rack system. For example, the thermal energy extracted may be transferred to a cooling loop, an air cooled element, or any other suitable cooling mechanism. In some embodiments, the thermal energy extracted by the heat exchanger, or any other heat extraction mechanism discussed herein, may be recaptured through a waste-heat recover procedure which may increase the efficiency of the immersion cooling arrangement of server system 100.

In addition, while depicted as being an entirely immersion cooled arrangement, it will be appreciated that the above described embodiment, and the other embodiments described herein, may be implemented as a hybrid system. In such a hybrid system a portion of server system 100 may be immersion cooled, as described herein, while another portion may be cooled through a conventional air cooled, closed loop liquid cooling system, etc. For example, in such embodiments, the vertical computing device trays 102 may be implemented in an immersion cooling arrangement as described above, while the horizontal computing device trays 104 may be implemented in a traditional closed loop liquid cooling arrangement.

Figure 2:
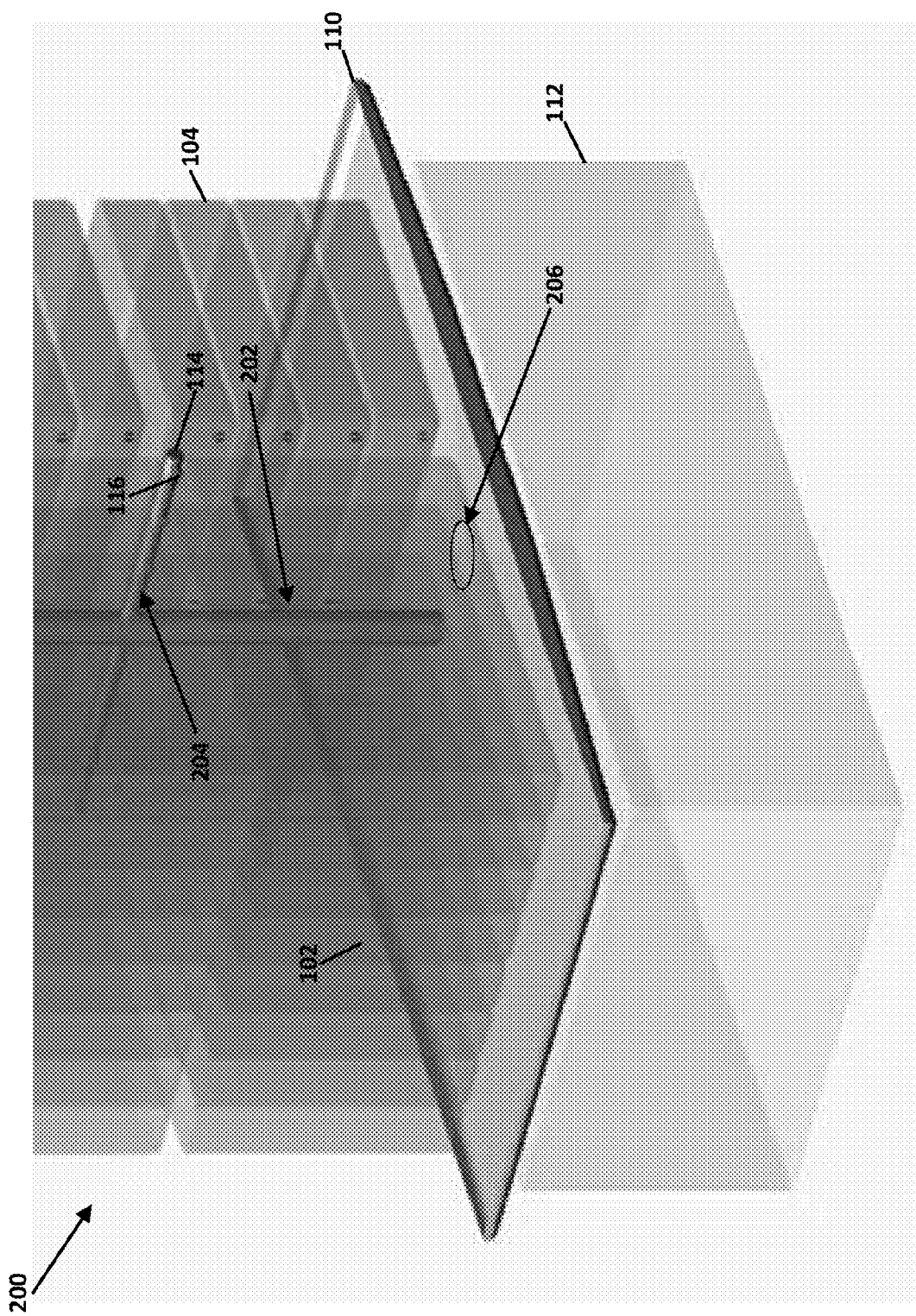
FIG. 2 illustrates a more detailed view of a portion of the immersion cooling arrangement of FIG. 1, in accordance with various embodiments of the present disclosure.

FIG. 2 illustrates a more detailed view of a portion 200 of immersion cooling arrangement of server system 100 of FIG. 1, in accordance with various embodiments of the present disclosure. Portion 200 depicts vertical computing device trays 102 and horizontal computing device trays 104. In this illustration, vertical computing device trays 102 have been made translucent to provide a more detailed view of an embodiment of distribution manifold 114 and the catchment area.

As depicted, in some embodiments, distribution manifold 114 may have a central tube 202 positioned to run vertically between the vertical computing trays 102 and the horizontal computing trays 104. Central tube 202 may be coupled with one or more branch tubes (e.g., branch tube 204) which may in turn be coupled with one or more injection ports (e.g., injection port 116). Central tube 202 may be configured to provide dielectric fluid to the one or more branch tubes which may be configured to provide dielectric fluid to the one or more injection ports. The injection ports may be configured to inject the dielectric fluid into the computing device trays to maintain a sufficient level of dielectric fluid in the computing device trays.

Central tube 202 may, in some embodiments, couple distribution manifold 114 with the catchment area to deliver the dielectric fluid that escapes from the computing device trays back to the computing device trays via the injection ports. This may be accomplished, for example, via an arrangement including an upper reservoir (e.g., upper reservoir 108 of FIG. 1). In such an arrangement, dielectric fluid may be pumped from the catchment reservoir 112 to the upper reservoir which may be configured to provide the dielectric fluid to the computing device trays via a gravity feed configuration. Such a gravity feed configuration may allow the dielectric fluid to fall into central tube 202, (e.g., via opening 126 of FIG. 1). Central tube 202 may be configured to direct the falling dielectric fluid to the one or more branch tubes for delivery to the one or more injection ports.

In other embodiments, a pump (e.g., pump 106 of FIG. 1) may directly couple central tube 202 with catchment reservoir 112. As discussed in FIG. 1, the pump may be located in the catchment reservoir 112 and may be coupled with a bottom portion of central tube 202 or a top portion of central tube 202. In such embodiments, the bottom portion of central tube 202 may protrude through catchment tray 110 into catchment reservoir 112. In other embodiments the pump may be located outside of the catchment area. This may be beneficial to prevent thermal energy produced by operation of the pump from contributing to thermal energy within the immersion cooling system. In such embodiments, the pump may be coupled with a portion of central tube 202 above the computing device trays and central tube may be configured to deliver dielectric fluid provided by the pump to the branch tubes in the same manner as that described above in reference to the gravity feed configuration.

As depicted, catchment tray 110 may form a perimeter around the computing device trays. Catchment tray 110 may be configured to catch the dielectric fluid that escapes from the computing device trays and may direct the fluid into catchment reservoir 112 via opening 206. While opening 206 is depicted as a single opening, it will be appreciated that catchment tray 110 may have any number of openings to direct fluid into catchment reservoir 112. In some embodiments, catchment tray 110 and catchment reservoir 112 may be formed together such that they form a single piece. In other embodiments, catchment tray 110 and catchment reservoir 112 may be two separate and distinct pieces formed individually.

Figure 3:
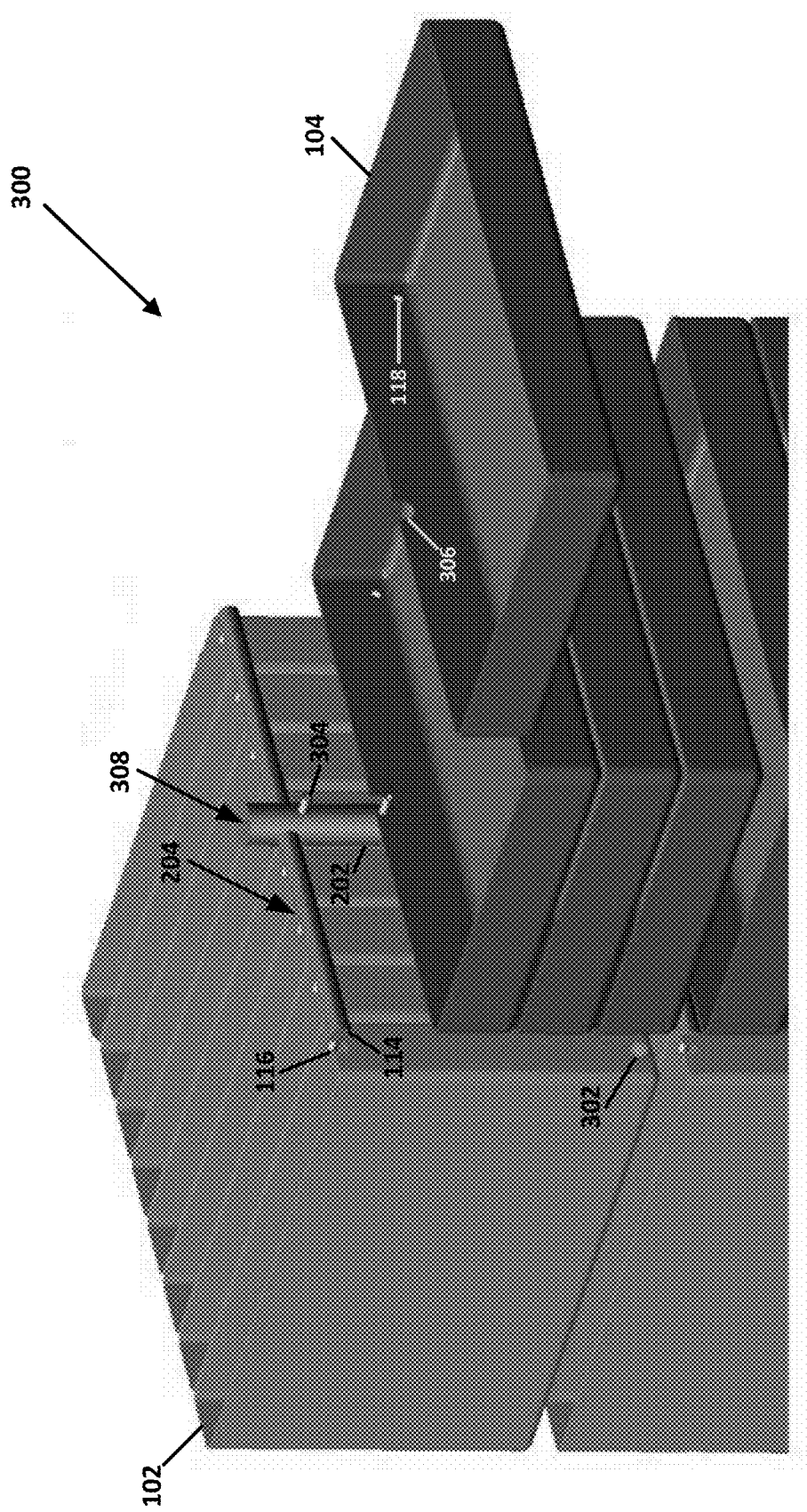
FIG. 3 illustrates a more detailed view of a portion of the immersion cooling arrangement of FIG. 1, in accordance with various embodiments of the present disclosure.

FIG. 3 illustrates a more detailed view of a portion 300 of an embodiment of the immersion cooling arrangement of server system 100 of FIG. 1. Portion 300 depicts a different perspective view of a top portion of the immersion cooling arrangement in embodiments without an upper reservoir. Portion 300 includes vertical computing device trays 102 and horizontal computing device trays 104. From the perspective depicted, outlet port 302 of one of the vertical computing device trays is visible. This outlet port may be configured to allow for the escape of dielectric fluid just as outlet port 118, discussed above in reference to FIG. 1, is configured. In addition, this depiction shows an inlet port 306 of horizontal computing device trays 104. Inlet port 306 may be configured to align with injection port 304 and may accept dielectric fluid being injected into the horizontal computing device trays.

Portion 300 includes a different perspective of distribution manifold 114 having injection port 304 configured to deliver dielectric fluid in a similar manner to injection port 116, described above. However, as can be seen, injection port 304 may be disposed on central tube 202 rather than a branch tube (e.g., branch tube 102). As depicted, central tube 202 may, in some embodiments, have a solid top 308. In such embodiments, central tube 202 may be coupled with a pump (e.g., pump 106 of FIG. 1) on a lower portion of central tube 202. The pump may deliver dielectric fluid from a catchment area, such as that discussed above, up through central tube 202 to injection ports disposed on central tube 202 and/or one or more branch tubes (e.g., branch tube 204). The one or more branch tubes may then deliver the dielectric fluid to one or more injection ports (e.g., injection port 116) disposed on the one or more branch tubes which may in turn inject dielectric fluid into individual computing device trays.

Figure 4:
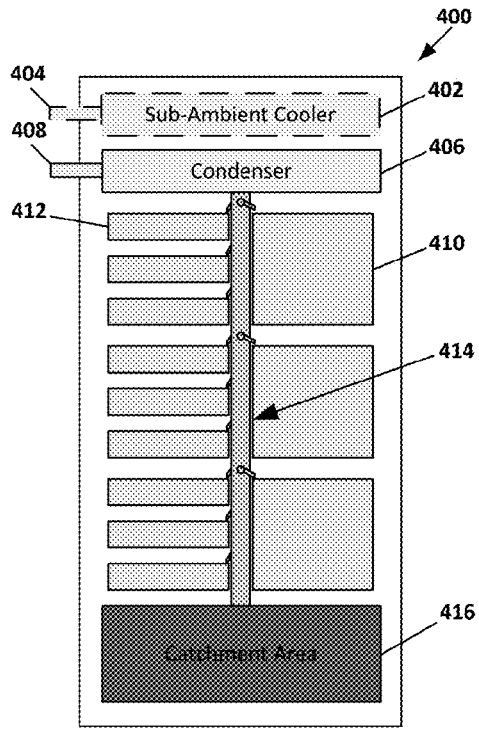
FIG. 4 illustrates a schematic representation of an immersion cooling arrangement further having a condenser, in accordance with various embodiments of the present disclosure.

FIG. 4 illustrates a schematic representation of a server system having a two-phase immersion cooling arrangement, in accordance with various embodiments. Two-phase immersion cooling arrangement of server system 400 may include vertical computing device trays 410 and horizontal computing device trays 412, hereinafter referred to collectively as computing device trays for simplicity. The computing device trays may be configured to hold dielectric fluid, such as the dielectric fluid discussed above, and one or more circuit boards (e.g., circuit boards 122 of FIG. 1), immersed in the dielectric fluid. The dielectric fluid may be configured to absorb thermal energy generated by the one or more circuit boards. In embodiments, the dielectric fluid may be configured to vaporize into a dielectric gas in response to absorption of the thermal energy generated by the one or more circuit boards. This may be accomplished by choosing or designing a dielectric fluid with a boiling point substantially equal to or below a satisfactory operational temperature of the one or more circuit boards. As used herein a satisfactory operational temperature may refer to a temperature at which the one or more circuit boards may operate without risk of damage from thermal energy produced by the operation of the one or more circuit boards.

In these two-phase embodiments, the computing device trays may have an opening in the top, such as the open top of the computing device trays discussed above, for escape of dielectric fluid in the form of a dielectric gas from the computing device trays into the server rack assembly. This escape of dielectric gas into the server rack assembly may allow thermal energy absorbed by the dielectric gas to move away from the one or more circuit boards. In order to maintain a sufficient level of dielectric fluid in the computing device trays for cooling, the computing device trays may have additional openings to allow for the delivery of dielectric fluid to the computing device trays. In some embodiments, the opening for escape of the dielectric gas from the individual computing device trays and the opening for delivery of the dielectric fluid to the individual computing device trays may be the same opening. For example, a top opening, as described above, may allow for release of the dielectric gas resulting from the vaporization of the dielectric liquid while also allowing for the injection of dielectric liquid through the same top opening.

In some two-phase embodiments additional dielectric fluid may also escape while still in liquid form through an opening, such as outlet port 118 discussed above in reference to FIGS. 1-3 and outlet port 302 discussed above in reference to FIG. 3. In such embodiments, the dielectric fluid that escapes while still in a liquid phase may be circulated via a fluid circulation system including catchment area 416 and central tube 414 which may be configured in a similar manner to the catchment area described above in reference to FIGS. 1-3.

In embodiments, the two-phase cooling arrangement may also include condenser 406. Condenser 406 may be configured to carry out a condensation process to extract thermal energy from the dielectric gas and thereby cause the dielectric gas to condense back into a dielectric fluid. Such a process may be carried out by running a liquid or gas through condenser 406. Such a liquid or gas may be cooled by a cooling mechanism, for example by a cooling loop, an air cooled element, or any other suitable cooling mechanism, to a temperature below a condensation point of the dielectric gas. A cooling loop may be implemented in any conventional manner. The liquid or gas may absorb thermal energy from the dielectric gas to cause the dielectric gas to condense back into a dielectric liquid. The thermal energy extracted by the liquid or gas may be routed from condenser 406 via pipe 408 to the cooling loop where thermal energy may be extracted from the liquid or gas. The liquid or gas may then return to condenser 406 via another pipe, not depicted, where the condensation process described above may repeat. In embodiments, the cooling loop may be external to either the cooling system 400 or the server rack assembly to prevent thermal energy extracted by the cooling loop from contributing to the thermal energy of cooling system 400. In some embodiments, the dielectric fluid resulting from the condensation of the dielectric gas may fall back into the computing device trays and any dielectric fluid that may miss the computing device trays may fall into catchment area 416 for recirculation back to the computing device trays. In other embodiments, an upper reservoir, such as upper reservoir 108 of FIG. 1, may be positioned below the condenser to collect the dielectric fluid resulting from the condensation process. In such embodiments, the dielectric fluid may then be delivered to the computing device trays via a gravity feed configuration, such as that described above.

In some embodiments, condenser 406 may not extract enough thermal energy from the dielectric gas to return a sufficient amount of the dielectric gas to a dielectric fluid. In such embodiments, sub-ambient cooler 402 may be optionally employed to further extract thermal energy from the dielectric gas to result in a greater quantity of dielectric gas being returned to dielectric fluid. The thermal energy extracted by sub-ambient cooler 402 may be routed out of sub-ambient cooler via pipe 404 to a cooling mechanism, such as a cooling loop like that described above; an air cooled element configured to exhaust sufficient thermal energy into the air, or any other suitable cooling mechanism.

In some embodiments, as the dielectric fluid is converted to a dielectric gas, pressure inside cooling system 400 or server rack assembly may begin to increase. In such embodiments, cooling system 400 may have a pressure sensor integrated therewith. The pressure sensor may be configured to measure an ambient air pressure of cooling system 400 or the server rack assembly. In such embodiments, condenser 406 and/or sub-ambient cooler 402 may be configured to carry out the condensation process described above in response to the ambient air pressure of cooling system 400 or the server rack system reaching or exceeding a predefined threshold. It will be appreciated that, while cooling system 400 is discussed above in reference to a two-phase embodiment, cooling system 400 could also be implemented into a single phase embodiment to remove thermal energy from the air within cooling system 400.

Figure 5:
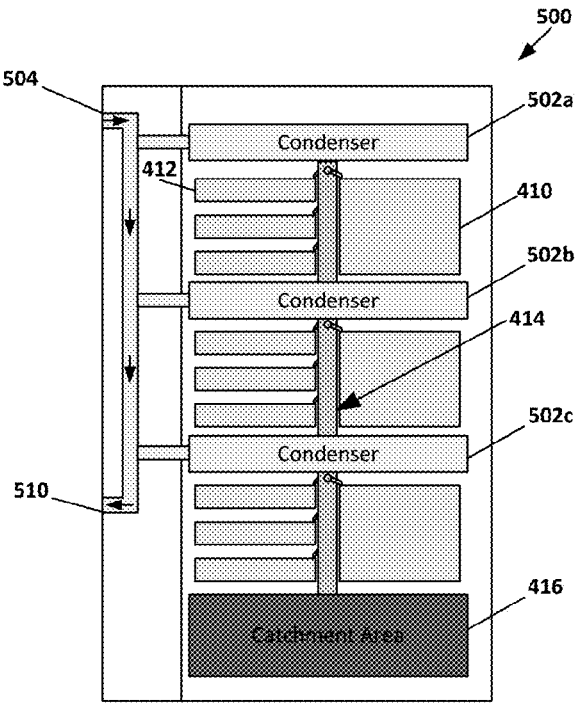
FIG. 5 illustrates a schematic representation of an immersion cooling arrangement having multiple condensers, in accordance with various embodiments of the present disclosure.

FIG. 5 illustrates a schematic representation of a server system 500 having an alternate immersion cooling arrangement, in accordance with various embodiments. The alternate immersion cooling arrangement of server system 500 may, at the core, be configured similarly to the two-phase immersion cooling arrangement of server system 400, except that multiple condensers 502a-c may be employed to carry out the condensation process. As depicted, condensers 502a-c may be configured to correspond with tiers of vertical computing device trays 102; however, it will be appreciated that multiple condenser configurations may take the form of any number of suitable configurations depending on the cooling requirements and configuration of server system 500. Furthermore, in some embodiments, one or more separate condensers may be employed for vertical computing device trays 410 while one or more different condensers may be employed for the horizontal computing device trays 412. Thermal energy extracted by condensers 502a-c may be routed away from condensers 502a-c via output 510 which may be coupled to a complementary cooling mechanism, such as a cooling loop like that discussed above, an air cooled element, or any other suitable cooling mechanism external to the server rack assembly while output from the cooling mechanism may enter the immersion cooling arrangement of server system 500 at 504. While depicted as being in front of the vertical computing device trays, it will be appreciated that the flow to and from the cooling mechanism may be disposed alongside the computing device trays to allow access to the front of all of the computing device trays. It will be appreciated that, while cooling system 500 is discussed above in reference to a two-phase embodiment, cooling system 500 could also be implemented into a single phase embodiment to remove thermal energy from the air within cooling system 500.

Figure 6:
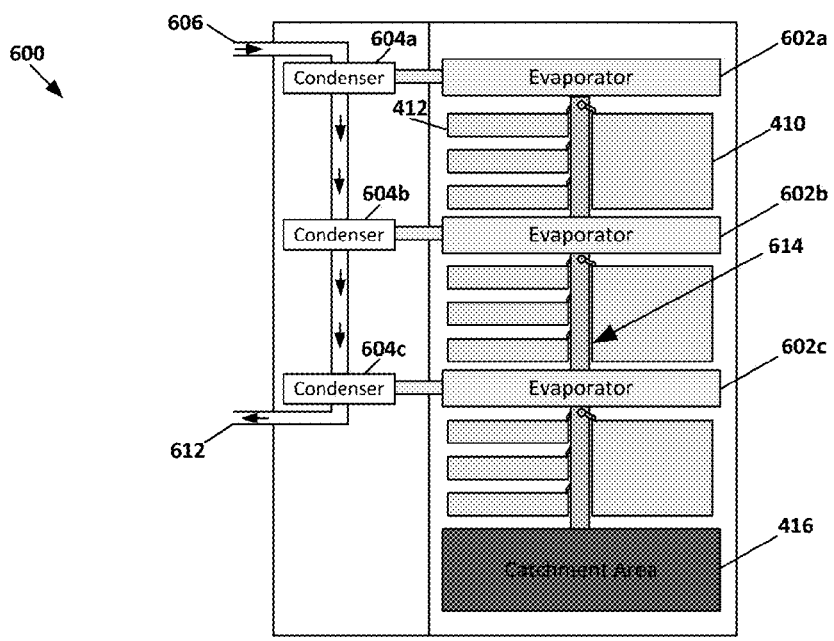
FIG. 6 illustrates a schematic representation of an immersion cooling arrangement further having an evaporator and a condenser, in accordance with various embodiments of the present disclosure.

FIG. 6 illustrates a schematic representation of another alternative immersion cooling arrangement of sever system 600, in accordance with various embodiments of the present disclosure. The alternative immersion cooling arrangement of server system 600 may, at the core, be configured similarly to the immersion cooling arrangement of server system 500, except that condensers 502a-c of FIG. 5 may be replaced with evaporator/condenser combinations, such as evaporators 602a-c coupled with condensers 604a-c, respectively. The evaporator/condenser combinations may be employed to carry out the condensation process described above. In such embodiments, thermal energy may be absorbed by a liquid contained within evaporators 602a-c which may cause the liquid to evaporate into a gas. The gas may then move thermal energy absorbed by the gas to condensers 604a-c, which may absorb the thermal energy, in a similar manner to that described above in reference to FIG. 4, from the gas causing the gas to return to a liquid. The liquid may then flow back to the evaporator where this cycle may be repeated. Thermal energy extracted by condensers 604a-c may be routed away from condensers 604a-c via output 612 which may be coupled to a cooling mechanism, such as a cooling loop like that discussed in reference to FIG. 4, an air cooled element, or any other suitable cooling mechanism, and output from the cooling mechanism may enter cooling system 600 at 606. While condensers 604a-c are depicted as being in front of the vertical computing device trays, it will be appreciated that condensers 604a-c and the flow to and from the cooling mechanism may be disposed alongside the computing device trays to allow access to the front of all of the computing device trays. In addition, in some embodiments, the evaporator/condenser combinations may take the form of a heat pipe. It will be appreciated that, while cooling system 600 is discussed above in reference to a two-phase embodiment, cooling system 600 could also be implemented into a single phase embodiment to remove thermal energy from the air within cooling system 600.

Figure 7:
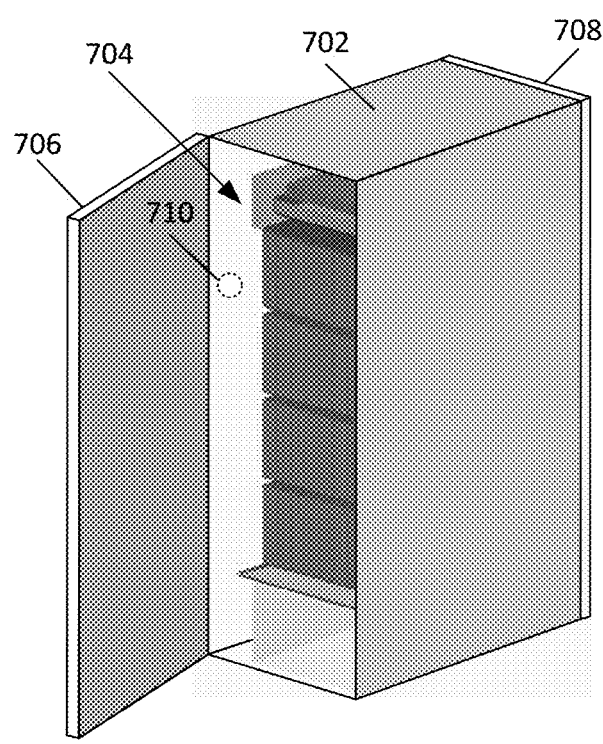
FIG. 7 illustrates a perspective view of server system having the immersion cooling arrangement of the present disclosure disposed in an enclosure, in accordance with various embodiments of the present disclosure.

FIG. 7 schematically illustrates a server system 704 with the server circuit boards and the immersion cooling arrangement disposed in an enclosure 702, in accordance with various embodiments. In embodiments, the immersion cooling arrangement of server system 704 may be any of the immersion cooling arrangements described above. Enclosure 702 may be configured to house the server circuit boards and the immersion cooling arrangement. In embodiments, enclosure 702 may have one or more access doors, such as access door 706 and access door 708. These access doors may enable easy servicing of the server circuit boards and the immersion cooling arrangement 704. For example, access door 706 may allow access to vertical computing device trays while access door 708 may allow access to horizontal computing device trays. In some embodiments, enclosure 702 may be configured to be sealed when access doors 706 and 708 are closed. This may be beneficial, to limit or prevent thermal energy from outside the enclosure from being introduced into immersion cooling system 704. In addition, in two phase embodiments, a sealed enclosure may prevent dielectric gas from escaping from immersion cooling system 704. In some embodiments, a pressure sensor 710, such as that described above in reference to FIG. 4 may also be incorporated into enclosure 702. In other embodiments, such a pressure sensor may be incorporated into immersion cooling system 704.

EXAMPLES

Some non-limiting examples are:

Example 1 may include an apparatus for immersion cooling comprising: a plurality of trays, each tray of the plurality of trays to hold one or more circuit boards and having a first opening to allow dielectric fluid to be injected into the tray, and a second opening, to allow for escape of the dielectric fluid out of the tray; and a fluid circulation system including: a catchment area, disposed below the plurality of trays, to collect the dielectric fluid that escapes from the plurality of trays; and a distribution manifold having a plurality of injection ports disposed above or adjacent to respective trays of the plurality of trays, the distribution manifold coupled with the catchment area, to deliver the dielectric fluid collected in the catchment area back to the plurality of trays via the injection ports.

Example 2 may include the subject matter of Example 1, wherein the dielectric fluid is to absorb thermal energy generated by the one or more circuit boards and move the thermal energy away from the one or more circuit boards via the escape of the dielectric fluid into the interior of the apparatus.

Example 3 may include the subject matter of Example 2, wherein the second opening is designed to enable the escape of the dielectric fluid via one or more of: leakage of the dielectric fluid; overflow of the dielectric fluid; or vaporization of the dielectric fluid.

Example 4 may include the subject matter of Example 2, wherein the second opening is an outlet port disposed on a side or bottom of the tray to allow for leakage of the dielectric fluid from the tray.

Example 5 may include the subject matter of Example 2, wherein the dielectric fluid is to vaporize into dielectric gas in response to absorption of thermal energy emitted by the one or more circuit boards, and wherein the second opening includes a top opening to allow for escape of the dielectric gas from the tray.

Example 6 may include the subject matter of Example 5, further comprising a condenser to carry out a condensation process to remove thermal energy from the dielectric gas to cause the dielectric gas to condense back into a dielectric fluid, and to route the thermal energy removed from the dielectric gas to a cooling loop.

Example 7 may include the subject matter of Example 6, further comprising a sub-ambient cooler to further remove thermal energy from the dielectric gas.

Example 8 may include the subject matter of Example 6, wherein the catchment area is a first catchment area, and wherein the fluid circulation system further includes a second catchment area, coupled with the distribution manifold, disposed below the condenser to collect the dielectric fluid resulting from the condensation process.

Example 9 may include the subject matter of Example 6, further comprising a pressure sensor to output a measurement of ambient air pressure, and wherein the condenser is to carry out the condensation process in response to a determination that the measurement of the ambient air pressure reaches or exceeds a pre-defined threshold.

Example 10 may include the subject matter of Example 6, further comprising one or more additional condensers disposed at different locations around trays or the fluid circulation system.

Example 11 may include the subject matter of Example 5, further comprising one or more evaporators to remove thermal energy from the dielectric gas to cause the dielectric gas to condense back into a dielectric fluid; and one or more condensers, coupled with respective evaporators, to remove thermal energy from the evaporator and route the thermal energy removed from the evaporator to a cooling loop, wherein the one or more evaporators and the one or more condensers coupled with the respective evaporators form one or more heat pipes.

Example 12 may include the subject matter of any one of Examples 1-11, wherein the fluid circulation system further includes a pump coupled with the catchment area and the distribution manifold, wherein the pump is to deliver the dielectric fluid collected in the catchment area to the distribution manifold.

Example 13 may include the subject matter of Example 12, wherein the pump is to deliver the dielectric fluid collected in the catchment area at a rate equal to or greater than a rate at which the dielectric fluid escapes from the plurality of trays.

Example 14 may include the subject matter of Example 12, wherein the fluid circulation system further includes a heat exchanger coupled with the pump, and wherein the heat exchanger is to remove thermal energy from the dielectric fluid.

Example 15 may include the subject matter of any one of Examples 1-11, wherein the first opening is an inlet port to accept delivery of the dielectric fluid from at least one of the injection ports of the distribution manifold.

Example 16 may include the subject matter of any one of Examples 1-11, wherein the apparatus is a computer server rack assembly.

Example 17 may include the subject matter of any one of Examples 1-11, wherein the apparatus is a computer server, further comprising the one or more circuit boards.

Example 18 may include the subject matter of any one of Examples 1-11, wherein a first subset of the plurality of trays are disposed vertically in the apparatus, and wherein a second subset of the plurality of trays are disposed horizontally.

Example 18 may include a method for immersion cooling comprising: providing, by a distribution manifold of an immersion cooling arrangement of a server system, dielectric fluid to a plurality of trays, wherein each tray of the plurality of trays holds one or more circuit boards immersed in the dielectric fluid and each tray has a first opening allowing the dielectric fluid to be injected into the tray by the distribution manifold, and a second opening allowing the dielectric fluid to escape from the tray into the interior of the server system; collecting, by a catchment area of the immersion cooling arrangement, the dielectric fluid that escapes from the plurality of trays; and recirculating, by a pump of the immersion cooling arrangement, the dielectric fluid collected by the catchment area back to the distribution manifold for distribution to the plurality of trays.

Example 19 may include the subject matter of Example 18, further comprising absorbing, by the dielectric fluid, thermal energy generated by the one or more circuit boards; and moving the thermal energy away from the one or more circuit boards via escape of the dielectric fluid into the interior of the server system.

Example 20 may include the subject matter of Example 19, wherein escape of the dielectric fluid occurs via one or more of: leaking of the dielectric fluid; overflowing of the dielectric fluid; or vaporizing of the dielectric fluid.

Example 21 may include the subject matter of Example 19, wherein the second opening is an outlet port, and wherein escape of the dielectric fluid occurs via leaking of the dielectric fluid from the tray via the outlet port.

Example 22 may include the subject matter of Example 18, further comprising: absorbing, by the dielectric fluid, thermal energy emitted by the one or more circuit boards, causing the dielectric fluid to vaporize into a dielectric gas, wherein the second opening allows for escape of the dielectric gas from the tray.

Example 23 may include the subject matter of Example 19, further comprising: condensing, by a condenser of the immersion cooling arrangement, the dielectric gas back into a dielectric fluid via removal of thermal energy from the dielectric gas; and routing, by a conduit, the thermal energy removed from the dielectric gas to a cooling loop.

Example 24 may include the subject matter of Example 23, further comprising: removing, by a sub-ambient cooler of the server system, additional thermal energy from the dielectric gas.

Example 25 may include the subject matter of Example 23, wherein the catchment area is a first catchment area, and further comprising: collecting, by a second catchment area disposed below the condenser, the dielectric fluid resulting from the condensing.

Example 26 may include the subject matter of Example 23, determining, via a pressure sensor of the server system, whether an ambient air pressure of the server system reaches or exceeds a pre-defined threshold, and wherein the condensing is based on a result of the determining.

Example 27 may include the subject matter of Example 22, further comprising: removing, by one or more evaporators of the server system, thermal energy from the dielectric gas to cause the dielectric gas to condense back into a dielectric fluid; and removing, by one or more condensers of the server system, thermal energy from the evaporator; and routing, by a conduit, the thermal energy removed from the evaporator to a cooling loop.

Example 28 may include the subject matter of any one of Examples 18-28, delivering, by a pump of the server system, the dielectric fluid collected in the catchment area to the distribution manifold.

Example 29 may include the subject matter of Example 29, wherein delivering, by the pump, the dielectric fluid further comprises delivering the dielectric fluid at a rate equal to or greater than a rate at which the dielectric fluid escapes from the plurality of trays.

Example 30 may include the subject matter of any one of Examples 18-29, wherein the recirculating further comprises: cooling, by a heat exchanger of the immersion cooling arrangement, the dielectric fluid to reduce thermal energy contained within the dielectric fluid to enable the dielectric fluid to absorb more thermal energy.

Example 31 may include a server system comprising: a plurality of circuit boards; and an immersion cooling arrangement having: a plurality of trays, each tray of the plurality of trays holding one or more of the plurality of circuit boards immersed in a dielectric fluid and having a first opening for injection of the dielectric fluid into the tray, and a second opening, for escape of the dielectric fluid from the tray; a catchment area, disposed below the plurality of trays, to collect the dielectric fluid that escapes from the plurality of trays; and a distribution manifold having a plurality of injection ports disposed above or adjacent to respective trays of the plurality of trays, the distribution manifold coupled with the catchment area, to deliver the dielectric fluid collected in the catchment area back to the plurality of trays via the injection ports.

Example 32 may include the subject matter of Example 31, wherein the dielectric fluid is to absorb thermal energy generated by the one or more circuit boards and move the thermal energy away from the one or more circuit boards via the escape of the dielectric fluid into the interior of the apparatus.

Example 33 may include the subject matter of Example 32, wherein the second opening is designed to enable the escape of the dielectric fluid via one or more of: leakage of the dielectric fluid; overflow of the dielectric fluid; or vaporization of the dielectric fluid.

Example 34 may include the subject matter of Example 32, wherein the second opening is an outlet port disposed on a side or bottom of the tray to allow for leakage of the dielectric fluid from the tray.

Example 35 may include the subject matter of Example 31, wherein the dielectric fluid is to vaporize into dielectric gas in response to absorption of thermal energy emitted by the one or more circuit boards, and wherein the second opening includes a top opening to allow for escape of the dielectric gas from the tray, and further comprising a condenser to carry out a condensation process to remove thermal energy from the dielectric gas to cause the dielectric gas to condense back into a dielectric fluid.

Example 36 may include the subject matter of Example 35, further comprising a condenser to carry out a condensation process to remove thermal energy from the dielectric gas to cause the dielectric gas to condense back into a dielectric fluid, and to route the thermal energy removed from the dielectric gas to a cooling loop.

Example 37 may include the subject matter of Example 36, further comprising a sub-ambient cooler to further remove thermal energy from the dielectric gas.

Example 38 may include the subject matter of Example 36, wherein the catchment area is a first catchment area, and wherein the immersion cooling arrangement further includes a second catchment area, coupled with the distribution manifold, disposed below the condenser to collect the dielectric fluid resulting from the condensation process.

Example 39 may include the subject matter of Example 36, further comprising a pressure sensor to output a measurement of ambient air pressure within the server system, and wherein the condenser is to carry out the condensation process in response to a determination that the measurement of the ambient air pressure reaches or exceeds a pre-defined threshold.

Example 40 may include the subject matter of Example 36, further comprising one or more additional condensers disposed at different locations around trays or the immersion cooling arrangement.

Example 41 may include the subject matter of Example 35, further comprising one or more evaporators to remove thermal energy from the dielectric gas to cause the dielectric gas to condense back into a dielectric fluid; and one or more condensers, coupled with respective evaporators, to remove thermal energy from the evaporator and route the thermal energy removed from the evaporator to a cooling loop, wherein the one or more evaporators and the one or more condensers coupled with the respective evaporators form one or more heat pipes.

Example 42 may include the subject matter of any one of Examples 31-41, wherein the immersion cooling arrangement further includes a pump coupled with the catchment area and the distribution manifold, wherein the pump is to deliver the dielectric fluid collected in the catchment area to the distribution manifold.

Example 43 may include the subject matter of Example 42, wherein the pump is to deliver the dielectric fluid collected in the catchment area at a rate equal to or greater than a rate at which the dielectric fluid escapes from the plurality of trays.

Example 44 may include the subject matter of Example 42, wherein the fluid circulation system further includes a heat exchanger coupled with the pump, and wherein the heat exchanger is to remove thermal energy from the dielectric fluid.

Example 45 may include the subject matter of any one of Examples 31-41, wherein the first opening is an inlet port to accept delivery of the dielectric fluid from at least one of the injection ports of the distribution manifold.

Example 46 may include the subject matter of any one of Examples 31-41, wherein the immersion cooling arrangement is a computer server rack assembly.

Example 47 may include the subject matter of any one of Examples 31-41, wherein a first subset of the plurality of trays are disposed vertically in the apparatus, and wherein a second subset of the plurality of trays are disposed horizontally.

Example 48 may include the subject matter of any one of Examples 31-41, further comprising an additional plurality of circuit boards and either an air cooled or closed loop liquid cooling arrangement for cooling the additional plurality of circuit boards.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus for immersion cooling comprising:
   a plurality of trays, each tray of the plurality of trays to hold one or more circuit boards and having a first opening to allow dielectric fluid to be injected into the tray, and a second opening, to allow for escape of the dielectric fluid out of the tray;
   a fluid circulation system including:
      a catchment area, disposed below the plurality of trays, to collect the dielectric fluid that escapes from the plurality of trays; and
      a distribution manifold having a plurality of injection ports disposed above or adjacent to respective trays of the plurality of trays, the distribution manifold coupled with the catchment area, to deliver the dielectric fluid collected in the catchment area back to the plurality of trays via the injection ports; and
   a pump coupled with the catchment area and the distribution manifold, the pump to deliver the dielectric fluid collected in the catchment area to the distribution manifold at a rate equal to or greater than a rate at which the dielectric fluid escapes from the plurality of trays.

2. The apparatus of claim 1, wherein the dielectric fluid is to absorb thermal energy generated by the one or more circuit boards and move the thermal energy away from the one or more circuit boards via the escape of the dielectric fluid into an interior of the apparatus.

3. The apparatus of claim 2, wherein the second opening is designed to enable the escape of the dielectric fluid via one or more of: leakage of the dielectric fluid; overflow of the dielectric fluid; or vaporization of the dielectric fluid.

4. The apparatus of claim 2, wherein the second opening is an outlet port disposed on a side or bottom of the tray to allow for leakage of the dielectric fluid from the tray.

5. The apparatus of claim 2, wherein the dielectric fluid is to vaporize into dielectric gas in response to absorption of thermal energy emitted by the one or more circuit boards, and wherein the second opening includes a top opening to allow for escape of the dielectric gas from the tray.

6. The apparatus of claim 5, further comprising a condenser to carry out a condensation process to remove thermal energy from the dielectric gas to cause the dielectric gas to condense back into a dielectric fluid, and to route the thermal energy removed from the dielectric gas to a cooling loop.

7. The apparatus of claim 6, further comprising a sub-ambient cooler to further remove thermal energy from the dielectric gas.

8. The apparatus of claim 6, wherein the catchment area is a first catchment area, and wherein the fluid circulation system further includes a second catchment area, coupled with the distribution manifold, disposed below the condenser to collect the dielectric fluid resulting from the condensation process.

9. The apparatus of claim 6, further comprising a pressure sensor to output a measurement of ambient air pressure, and wherein the condenser is to carry out the condensation process in response to a determination that the measurement of the ambient air pressure reaches or exceeds a pre-defined threshold.

10. The apparatus of claim 6, further comprising one or more additional condensers disposed at different locations around trays or the fluid circulation system.

11. The apparatus of claim 5, further comprising one or more evaporators to remove thermal energy from the dielectric gas to cause the dielectric gas to condense back into a dielectric fluid; and one or more condensers, coupled with respective evaporators, to remove thermal energy from the evaporator and route the thermal energy removed from the evaporator to a cooling loop, wherein the one or more evaporators and the one or more condensers coupled with the respective evaporators form one or more heat pipes.

12. The apparatus of claim 1, wherein the fluid circulation system further includes a heat exchanger coupled with the pump, and wherein the heat exchanger is to remove thermal energy from the dielectric fluid.

13. The apparatus of claim 1, wherein the first opening is an inlet port to accept delivery of the dielectric fluid from at least one of the injection ports of the distribution manifold.

14. The apparatus of claim 1, wherein the apparatus is a computer server rack assembly.

15. The apparatus of claim 1, wherein the apparatus is a computer server, further comprising the one or more circuit boards.

16. A method for immersion cooling comprising:
providing, by a distribution manifold of an immersion cooling arrangement of a server system, dielectric fluid to a plurality of trays, wherein each tray of the plurality of trays holds one or more circuit boards immersed in the dielectric fluid and each tray has a first opening allowing the dielectric fluid to be injected into the tray by the distribution manifold, and a second opening allowing the dielectric fluid to escape from the tray into an interior of the server system;
collecting, by a catchment area of the immersion cooling arrangement, the dielectric fluid that escapes from the plurality of trays; and
recirculating, by a pump of the immersion cooling arrangement, the dielectric fluid collected by the catchment area back to the distribution manifold for distribution to the plurality of trays, wherein the recirculating is done at a rate equal to or greater than a rate at which the dielectric fluid escapes from the plurality of trays.

17. The method of claim 16, further comprising: absorbing, by the dielectric fluid, thermal energy emitted by the one or more circuit boards, causing the dielectric fluid to vaporize into a dielectric gas, wherein the second opening allows for escape of the dielectric gas from the tray.

18. The method of claim 17, further comprising:
condensing, by a condenser of the immersion cooling arrangement, the dielectric gas back into a dielectric fluid via removal of thermal energy from the dielectric gas; and
routing, by a conduit, the thermal energy removed from the dielectric gas to a cooling loop.

19. The method of claim 16, wherein the recirculating further comprises: cooling, by a heat exchanger of the immersion cooling arrangement, the dielectric fluid to reduce thermal energy contained within the dielectric fluid to enable the dielectric fluid to absorb more thermal energy.

20. A server system comprising:
a plurality of circuit boards; and
an immersion cooling arrangement having:
a plurality of trays, each tray of the plurality of trays holding one or more of the plurality of circuit boards immersed in a dielectric fluid and having a first opening for injection of the dielectric fluid into the tray, and a second opening, for escape of the dielectric fluid from the tray;
a catchment area, disposed below the plurality of trays, to collect the dielectric fluid that escapes from the plurality of trays; and
a distribution manifold having a plurality of injection ports disposed above or adjacent to respective trays of the plurality of trays, the distribution manifold coupled with the catchment area, to deliver the dielectric fluid collected in the catchment area back to the plurality of trays via the injection ports, wherein fluid is recirculated from the catchment area to the distribution manifold at a rate equal to or greater than a rate at which the dielectric fluid escapes from the plurality of trays to the catchment area.

21. The server system of claim 20, wherein the dielectric fluid is to vaporize into dielectric gas in response to absorption of thermal energy emitted by the one or more circuit boards, and wherein the second opening includes a top opening to allow for escape of the dielectric gas from the tray, and further comprising a condenser to carry out a condensation process to remove thermal energy from the dielectric gas to cause the dielectric gas to condense back into a dielectric fluid.

22. The server system of claim 21, further comprising a pressure sensor to output a measurement of ambient air pressure within the server system, and wherein the condenser is to carry out the condensation process in response to a determination that the measurement of the ambient air pressure reaches or exceeds a pre-defined threshold.

23. The server system of claim 20, further comprising an additional plurality of circuit boards and either an air cooled or closed loop liquid cooling arrangement for cooling the additional plurality of circuit boards.

* * * * *